(12) United States Patent
Xie et al.

(10) Patent No.: US 12,610,613 B2
(45) Date of Patent: Apr. 21, 2026

(54) NANOSHEET DEVICE WITH VERTICAL BLOCKER FIN

(71) Applicant: International Business Machines Corporation, Armonk, NY (US)

(72) Inventors: Ruilong Xie, Niskayuna, NY (US); Chen Zhang, Guilderland, NY (US); Heng Wu, Guilderland, NY (US); Julien Frougier, Albany, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 980 days.

(21) Appl. No.: 17/548,913

(22) Filed: Dec. 13, 2021

(65) Prior Publication Data

US 2023/0187443 A1     Jun. 15, 2023

(51) Int. Cl.
| | |
|---|---|
| *H10D 84/85* | (2025.01) |
| *H10D 30/01* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10P 14/20* | (2026.01) |
| *H10P 50/00* | (2026.01) |
| *H10P 50/24* | (2026.01) |

(52) U.S. Cl.
CPC .......... *H10D 84/85* (2025.01); *H10D 30/031* (2025.01); *H10D 30/6735* (2025.01); *H10D 30/6757* (2025.01); *H10D 62/118* (2025.01); *H10D 64/01318* (2026.01); *H10D 84/0167* (2025.01); *H10D 84/0177* (2025.01); *H10D 84/038* (2025.01); *H10P 14/3411* (2026.01); *H10P 14/3452* (2026.01); *H10P 50/242* (2026.01); *H10P 50/691* (2026.01)

(58) Field of Classification Search
CPC ............... H10D 84/85; H10D 30/6735; H10D 30/6757; H10D 30/43; H10D 62/118; H10D 62/364; H10D 62/121; H10D 64/518; B82Y 10/00
See application file for complete search history.

(56) References Cited

U.S. PATENT DOCUMENTS

| | | | |
|---|---|---|---|
| 7,060,539 B2 | 6/2006 | Chidambarrao et al. | |
| 8,158,484 B2 | 4/2012 | Orlowski et al. | |
| 8,785,972 B2 | 7/2014 | Morishita | |
| 9,184,238 B2 | 11/2015 | Hisada et al. | |
| 9,548,399 B2 | 1/2017 | Konrath et al. | |
| 9,741,716 B1 | 8/2017 | Cheng et al. | |
| 9,905,643 B1 * | 2/2018 | Bergendahl | B82Y 10/00 |
| 9,991,352 B1 | 6/2018 | Frougier et al. | |
| 9,997,519 B1 * | 6/2018 | Bao | H10D 30/014 |

(Continued)

FOREIGN PATENT DOCUMENTS

CN            111863944 A     10/2020

*Primary Examiner* — Ida M Soward
(74) *Attorney, Agent, or Firm* — L. Jeffrey Kelly

(57) ABSTRACT

A FET channel includes a stack of silicon nanosheets. The silicon nanosheets are oriented parallel to a planar portion of the FET in which the FET channel is formed. The FET channel also includes a vertical blocker fin. The vertical blocker fin is attached to at least one nanosheet in the stack of nanosheets.

20 Claims, 17 Drawing Sheets

100

(56) References Cited

U.S. PATENT DOCUMENTS

| | | | | |
|---|---|---|---|---|
| 10,510,622 B1 * | 12/2019 | Frougier | ................. | H10D 88/01 |
| 10,622,476 B2 | 4/2020 | Park et al. | | |
| 10,832,916 B1 * | 11/2020 | Xie | .................. | H10D 64/01326 |
| 10,903,315 B2 | 1/2021 | Loubet et al. | | |
| 10,903,369 B2 | 1/2021 | Xie et al. | | |
| 11,315,938 B1 * | 4/2022 | Reznicek | ............... | H10B 20/36 |
| 12,154,971 B2 * | 11/2024 | Cheng | .................. | H10D 30/014 |
| 2016/0020206 A1 | 1/2016 | Wang et al. | | |
| 2016/0163796 A1 * | 6/2016 | Obradovic | ......... | H10D 30/6757 |
| | | | | 257/9 |
| 2017/0213888 A1 * | 7/2017 | Chang | .................. | H10D 64/018 |
| 2019/0304848 A1 | 10/2019 | Cheng et al. | | |
| 2020/0006356 A1 * | 1/2020 | Ando | ..................... | B82Y 10/00 |
| 2020/0273710 A1 * | 8/2020 | Zhang | ............. | H10D 64/01354 |
| 2020/0343361 A1 | 10/2020 | Cheng | | |
| 2021/0265345 A1 * | 8/2021 | Xie | ...................... | H10D 62/116 |
| 2022/0130955 A1 * | 4/2022 | Cheng | ............... | H10D 84/0158 |
| 2022/0216203 A1 * | 7/2022 | Cheng | ................. | H10D 84/038 |
| 2022/0328478 A1 * | 10/2022 | Jhan | ................... | H10D 30/6735 |
| 2023/0085628 A1 * | 3/2023 | Xie | ................... | H10D 84/0135 |
| | | | | 257/369 |

* cited by examiner

200

202a
202b
202c
204a
204b
204c
206
208

COMPUTER SYSTEM ——601

NANOSHEET DEVICE WITH VERTICAL BLOCKER FIN

BACKGROUND

The present invention relates to nanosheet transistor devices, and more specifically, to forming nanosheet transistor devices.

Nanosheet transistor devices are similar to conceptual evolutions to fin-shaped transistor devices. Specifically, nanosheet transistor devices are designed to increase the exposure of a channel region in the transistor device to a gate region. Typical nanosheet devices do this by positioning multiple sheets of channel regions in a stack. A gap is formed between each sheet in the stack, and a gate material is formed within the gap.

Some circuit designs include a pattern of NFET transistor devices placed alongside PFET transistor devices. In nanosheet designs, each with of these side-by-side nFET and pFET devices contains a separate, parallel stack of channel regions. In typical such nanosheet designs, the gate region of the nFET devices differ from the pFET devices. In some devices, the gate region of the nFET device may be include an "nFET work function material" that is formed around each sheet. However, the gate region of the pFET device may include a "pFET work function material" that is formed around each sheet, and then itself surrounded by the nFET work function material.

SUMMARY

Some embodiments of the present disclosure can be illustrated as a nanosheet CMOS cell that comprises a first FET region with a first nanosheet channel. The nanosheet CMOS cell also comprises a second FET region with a second nanosheet channel. The second FET region comprises a vertical blocker fin attached to at least on sheet in the second nanosheet channel.

Some embodiments of the present disclosure can also be illustrated as a FET channel comprising a stack of silicon nanosheets. The silicon nanosheets are oriented parallel to a planar portion of the FET in which the FET channel is formed. The FET channel also comprises a vertical blocker fin attached to a nanosheet in the stack of nanosheets.

Some embodiments of the present disclosure can also be illustrated as, a method of forming a nanosheet CMOS cell. The method comprises forming a stack of alternating silicon sheets and sheets of sacrificial material. The method also comprises patterning hardmask and blocking layers upon the top sheet in the stack. The method also comprises etching a gap through the sheets in the stack. The method also comprises conformally trimming the exposed sides of the sheets in the gap. The also method comprises applying vertical blocker fins to the sides of the trimmed sheets in the gap.

DETAILED DESCRIPTION

Figure 1:
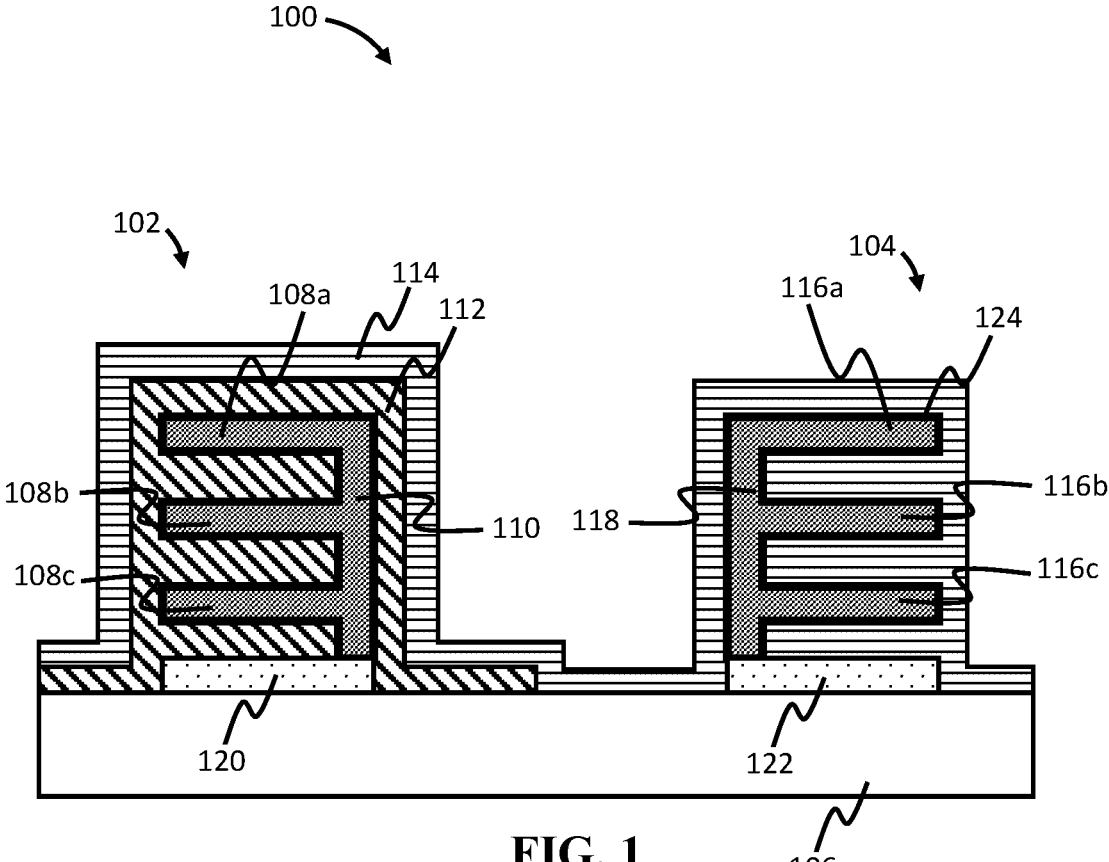
FIG. 1 depicts a nanosheet CMOS cell with a vertical blocking fins formed on the nanosheet channels.

Nanosheet and nanowire transistor devices (collectively referred to herein under the term "nanosheet devices," "nanosheet transistors," or "nanosheet FETs") provide advantages over previous field effect transistors (referred to herein as "FETs"). Specifically, planar FETs, while relatively simple to manufacture, typically exhibit a channel region that is susceptible to leaking charge to other regions, for example.

FinFETs were developed, in part, to address this deficiency of planar FETs. FinFETs include a channel region that is shaped like a fin extending from the planar portion of the FET. A gate is then formed around the fin channel, surrounding the channel on three sides. This provides an added layer of control over planar FETs, and helps to prevent leakage.

Nanosheet FETs were developed as an extension of the advantages of FinFETs. In nanosheet FETs, rather than a vertical fin extending from the planar portion of the transistor, a stack of multiple sheets or wires of channel material extend from the planar portion of the transistor. Each of these sheets or wires in the stack are typically surrounded on four sides by gate material. This not only increases the effective width of the transistor as compared to FinFETs, but also reduces charge leakage further.

However, nanosheet devices, due in part to their structural complexity, are more difficult to manufacture than planar FETs or FinFETs. One significant challenge occurs when designing CMOS cells composed of a pFET (a transistor that is "closed" when its gate is unpowered) adjacent to an nFET (a transistor that is "open" when its gate is unpowered"). Because these the FETs in the CMOS cell have opposite functions, each FET has a different gate design.

Specifically, the gate of a typical nanosheet nFET is often composed of a metal that surrounds the channel sheets. This metal is often referred to as the nFET work function material, or "nFET WFM." The gate of a typical nanosheet pFET, however, is often composed of a different metal that surrounds the channel sheets. Depending on the process used to create the CMOS cell, one of the FET gates is also covered by the work function material of the opposite FET.

For example, in some CMOS cells, the pFET channels are covered by a pFET work function material, which is then covered by the nFET work function material in turn. In other words, these pFET gates are formed of a pFET work function material (sometimes referred to as the "pFET WFM") that is covered by the nFET work function material. In these CMOS cells, the nFET gates, unlike the pFET gates, are composed solely of the nFET work function material, which is not covered by the pFET work function material. The manufacturing reasoning for this is explained below and in FIGS. 2A-2N.

In other CMOS cells, the nFET channels are covered by a pFET work function material, which is then covered by a pFET work function material in turn. In other words, these nFET gates are formed of an nFET work function material that is covered by the pFET work function material. In these CMOS cells, the pFET gates are composed solely by the pFET work function material.

Both of the above described CMOS cell types (i.e., a first type: pFET gate covered by nFET work function material and a second type: nFET gate covered by pFET work function material) are formed in a nearly identical method. This method will be discussed below and in FIGS. 2A-2N. The main distinction between formation of these two CMOS cell types relates to the order in which the work function materials are applied. As will be discussed below, in the first type, the pFET work function material is deposited over the CMOS cell, etched from the nFET side of the CMOS cell, and then the nFET work function material is deposited over the CMOS cell, including over the pFET work function material. In the second type, the nFET work function material is deposited over the CMOS cell, etched from the pFET side of the CMOS cell, and then the pFET work function material is deposited over the CMOS cell, including over the nFET work function material.

Further, both of the above described CMOS cell types function in a similar way. In both types, the nFET device is controlled by the nFET work function material, and the pFET device is controlled by the pFET work function material.

Due to the manufacturing and functional similarities between the first type of CMOS cell discussed above (i.e., pFET gate covered by nFET work function material) and the second type (i.e., nFET gate covered by pFET work function material), only a detailed discussion of one type will be included within the remainder of this disclosure. However, this is solely for the sake of brevity and simplicity; it should be noted that the methods and structures presented herein with respect to the first type could also apply to the second type by switching the order of applications (and, as applicable, removal) of the pFET and nFET work function materials, as discussed above.

For the purposes of clarity, however, the work function material that is deposited first in a CMOS cell (i.e., the pFET WFM in the first type of CMOS cell discussed above and the nFET WFM in the second type) may sometimes be referred herein to as the "initial work function material." The work function material that is deposited over the "initial work function material" (i.e., the nFET WFM in the first type of CMOS cell discussed above and the pFET WFM in the second type) may sometimes be referred to herein as the "subsequent work function material." Unless otherwise specified, the "initial work function material" and the "subsequent work function material" could apply to either a pFET work function material or an nFET work function material, depending on the manufacturing process utilized (as discussed above).

For the sake of manufacturing efficiency, the typical method of applying forming the gate around the pFET portion of the CMOS cell includes first forming the pFET work function material around the sheets of both the pFET portion and the nFET portion. The partial pFET gate is then covered by a protective material while the pFET work function material is etched off from the nFET sheets. This protective material is then removed, and an nFET work function material is then applied to both the pFET and nFET portions of the cell, completing both gates. In this example, the pFET work function material can be referred to as the initial work function material, and the nFET work function material can be referred to as the subsequent work function material.

However, due in part to the high effective surface area of the nFET channel sheets, etching all pFET work function material from the nFET region of the CMOS cell can be a relatively long process. In some instances, the amount of time that it takes to completely clear all four sides of each sheet of the pFET work function material is long enough to allow etchant to flow beneath the protective material that is applied on the pFET region. That etchant can then etch the pFET work function material that is on the pFET region. In other words, etching the pFET WFM off the nFET sheets can sometimes take long enough that the pFET gate metal is also partially etched. In some instances this can result in inefficient function of the pFET nanosheet device. In more extreme instances, this can result in non-function of the pFET nanosheet device.

Some embodiments of the present disclosure address the above challenges by attempting to slow the flow of etchant from the nFET region to the pFET region when etching the pFET WFM from the nFET sheets. For example, some embodiments of the present disclosure form a vertical blocking fin on the nFET stack of nanosheet channel structures. This blocking fin may be formed of the same material as the channel region (e.g., silicon). Thus, in addition to blocking excess etchant from flowing into the pFET region during etching of the nFET region, the blocking fin may also contribute to the effective width of the nFET channel region. Thus, in addition to avoiding unwanted etching of the partial pFET gate, the blocking fin may also increase performance of the nFET region.

For example, FIG. 1 depicts a nanosheet CMOS cell 100 with vertical blocking fins formed on the nanosheet channels. CMOS cell 100 contains a pFET region 102 and an nFET region 104. As illustrated, CMOS cell 100 is formed on a generic substrate region 106 for the purposes of simplicity. The properties of substrate region 106 may vary based on the embodiment. For example, in some embodiments, substrate region 106 may take the form of alternating regions of silicon directly below each channel region and a shallow-trench-isolation region (e.g., silicon dioxide) between the channel regions and on the side of each channel region. An example of a substrate region with these properties is illustrated in FIG. 2L.

The channel region of pFET region 102 includes a stack of nanosheets 108a, 108b, and 108c as well as a vertical blocking fin 110. The gate of pFET region 102 includes pFET work function material 112 that is covered by nFET work function material 114. Thus, in FIG. 1, pFET work function material 112 may be referred to as the initial work function material and nFET work function material 114 may be referred to as the subsequent work function material.

Note that gate dielectric layer 124 is present between the WFM and nanosheet channels (illustrated in FIG. 1 as a thick black line). pFET work function material 112 may be a metal, metal alloy, or metal oxide (e.g., ruthenium, palladium, platinum, cobalt, nickel, and conductive metal oxides, conductive nitrides such as TiN, conductive carbide such as TiC or TiAlC, or any combination thereof). nFET work function material 114, on the other hand, may include compositions such as hafnium, zirconium, titanium, tantalum, aluminum, metal carbides (e.g., hafnium carbide, zirconium carbide, titanium carbide, aluminum carbide, titanium aluminum carbide), aluminides, conductive nitrides such as TiN, titanium aluminum nitride, titanium aluminum carbon nitride, tantalum aluminum carbon nitride, lanthanum doped TiN, lanthanum doped TaN, or any combination thereof.

The channel region of nFET region 104, like the channel region of pFET region 102, includes a stack of nanosheets 116a, 116b, and 116c as well as a vertical blocking fin 118. The gate of nFET region 104 includes nFET work function material 114, which surrounds the nanosheets 116a-c and vertical blocking fin 118. As is illustrated in FIG. 2K, vertical blocking fin 118 may have beneficially protected pFET work function material 112 that is present in pFET region 102 from being etched while the unwanted pFET work function material was being etched from nFET region 104.

Of note, vertical blocking fin 110 in pFET region 102 may not have significantly contributed to the reduction of unwanted etching of pFET work function material 112. However, the presence of vertical blocking fin 110 in pFET region 102 may result in other benefits. For example, vertical blocking fin 110 may increase the overall surface area of the channel region of pFET region 102 that is exposed to the gate. This is similar to the previously discussed benefit of the nFET vertical blocking fin (here, vertical blocking fin 110) increasing the overall surface area of the nFET channel (here, nFET region 104) that is exposed to the gate. In other words, both vertical blocking fin 110 and vertical blocking fin 118 may increase the effective width of their respective transistor devices.

Further, there may be process efficiencies that result from forming a vertical blocking fin in pFET region 102 as well as in nFET region 104. These process efficiencies are discussed with respect to FIGS. 2D and 2E.

Figure 4:
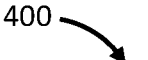
FIG. 4 depicts a nanosheet CMOS cell with shortened vertical blocker fins.
Figure 4:
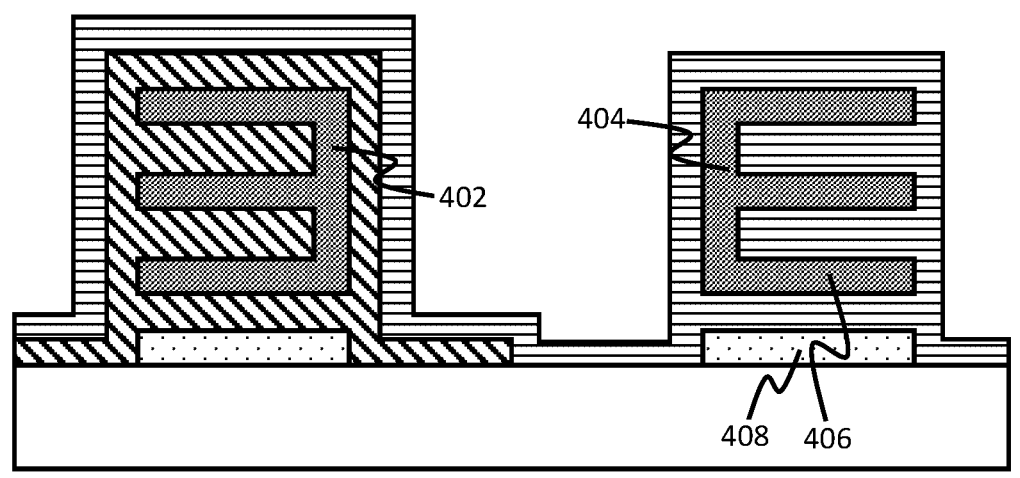

Also of note, each of pFET region 102 and nFET region 104 contain a bottom isolation layer 120 and 122. Bottom isolation layers 120 and 122 could be formed, by replacing an initial sacrificial epitaxy layer (e.g. SiGe60) with a dielectric liner (such as SiN, SiBCN, SiOCN, SiOC, etc.) after gate formation. While, as illustrated in FIG. 1, vertical blocking fins 110 and 118 appear to make contact with bottom isolation layers 120 and 122 respectively, in some embodiments gate dielectric layer 124 (such as hafnium oxide) may plug a gap between blocking fins 110 and 118 and isolation layers 120 and 122. Such an embodiment is illustrated within FIG. 2M. In other embodiments, for example, a small unplugged gap may exist between the blocking fin and the isolation layer. This may allow a small amount of etchant to proceed underneath the channel region of the nFET region towards the pFET region. This gap may allow a small amount of etchant may increase the speed of removing all pFET WFM from the nFET region, while preventing the flow of etchant enough to prevent damage to the pFET gate. Such an embodiment is illustrated in FIG. 4.

Because the structure of the channels in CMOS cell 100 represent a novel channel structure in CMOS technology, typical nanosheet formation processes are insufficient for forming CMOS cell 100. For this reason, some embodiments of the present disclosure depict a novel process for forming a CMOS cell with a channel of stacked nanosheets and a vertical blocking fin.

Figure 2A:
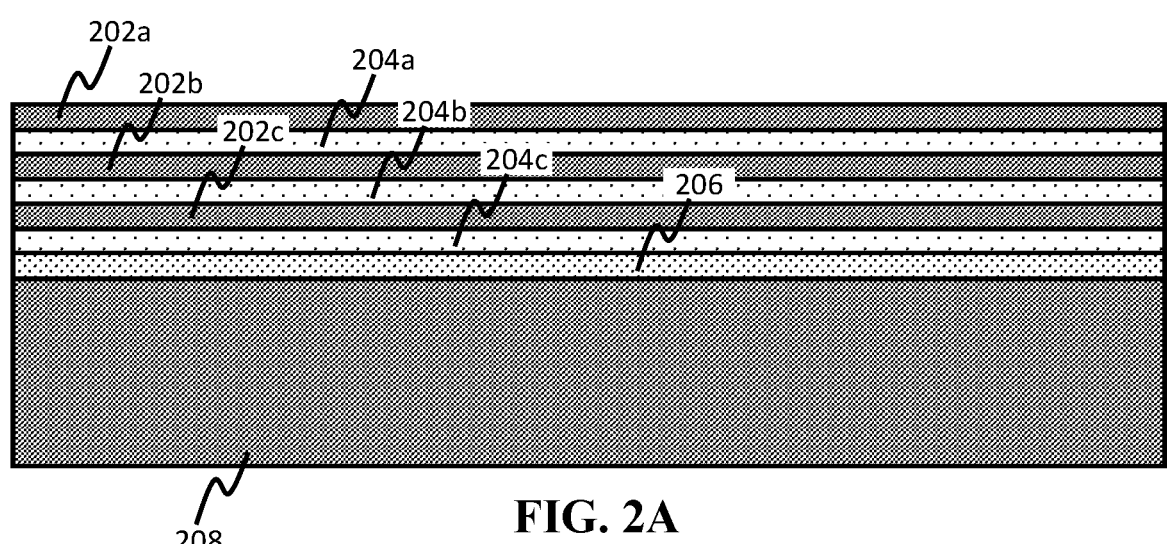
FIG. 2A depicts a first stage of forming a nanosheet CMOS cell with vertical fins, according to embodiments of the present disclosure.
Figure 2B:
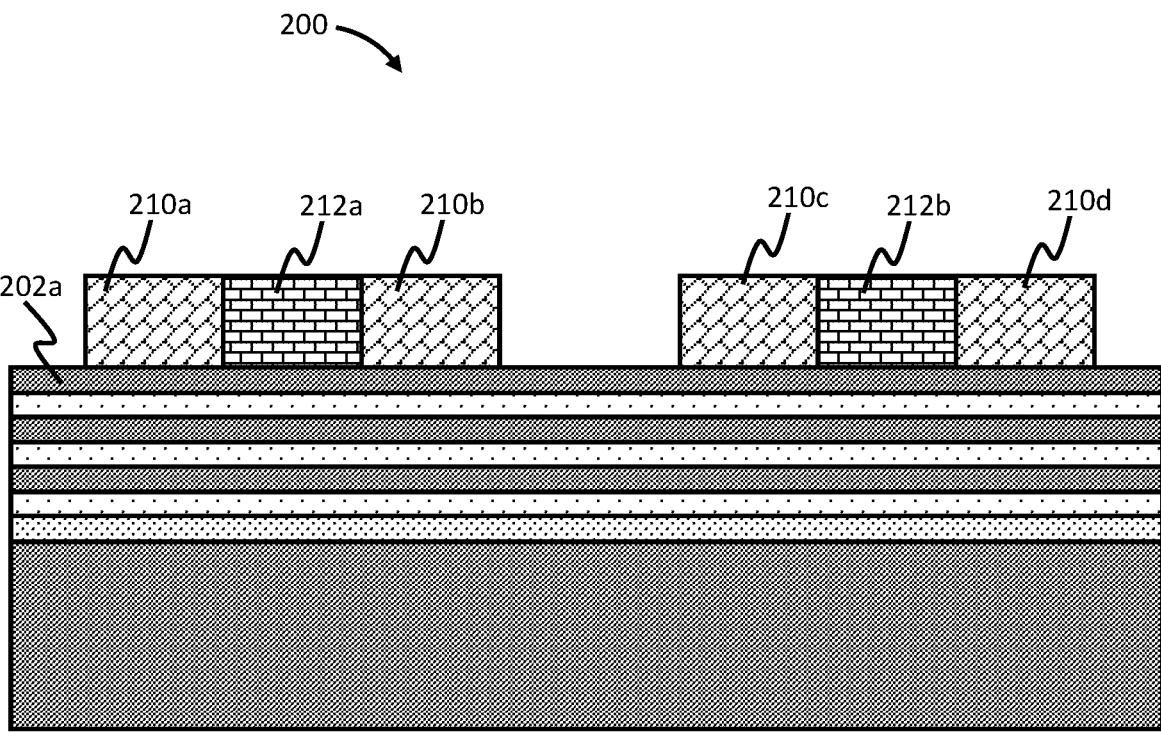
FIG. 2B depicts a second stage of forming the nanosheet CMOS cell with vertical fins, according to embodiments of the present disclosure.
Figure 2C:
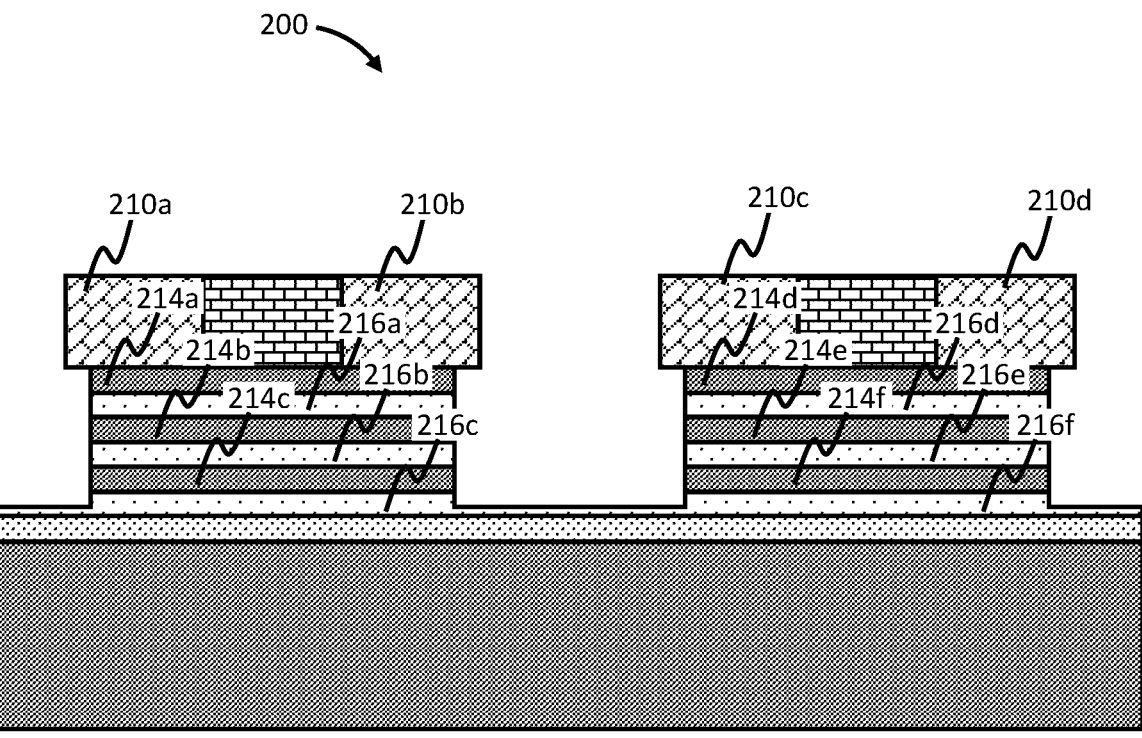
FIG. 2C depicts a third stage of forming the nanosheet CMOS cell with vertical fins, according to embodiments of the present disclosure.
Figure 2D:
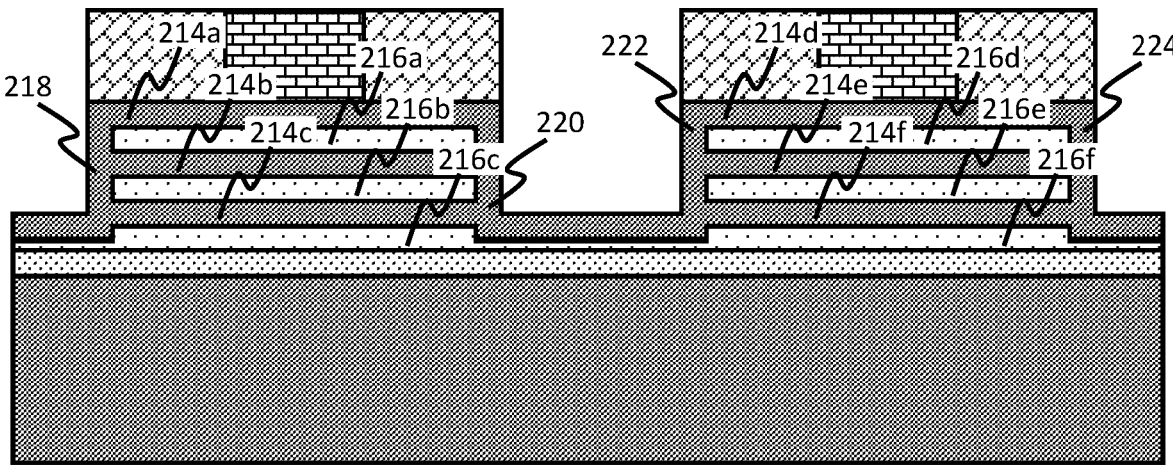
FIG. 2D depicts a fourth stage of forming the nanosheet CMOS cell with vertical fins, according to embodiments of the present disclosure.
Figure 2E:
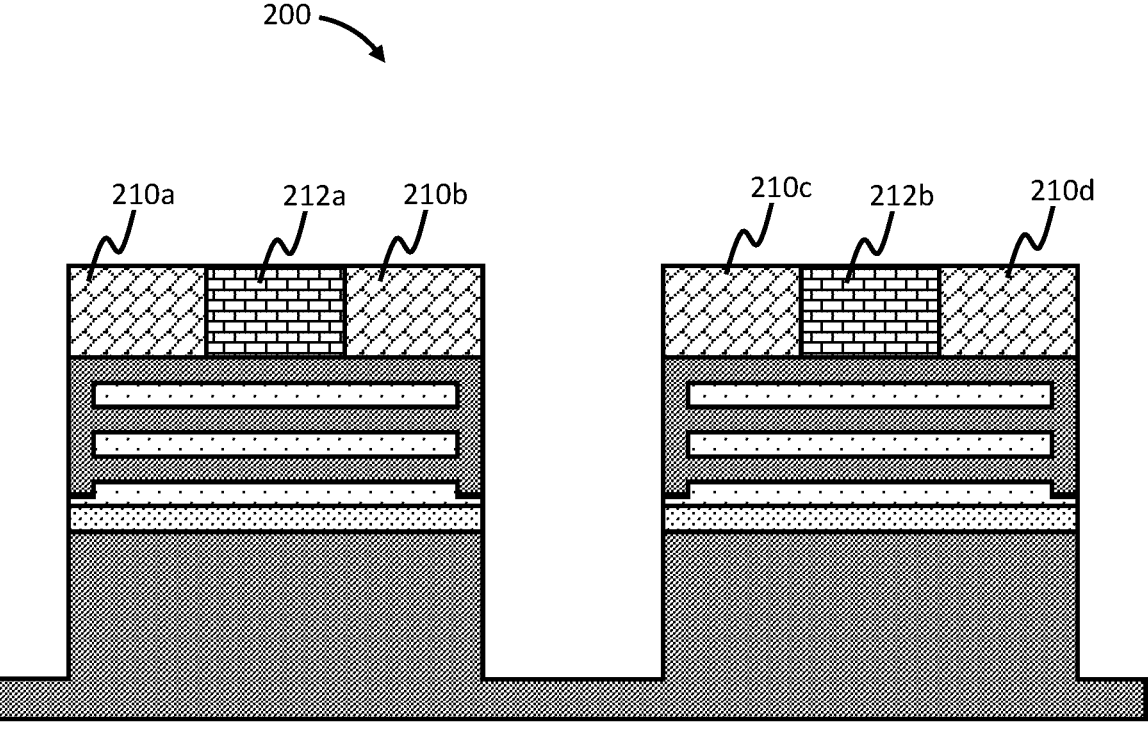
FIG. 2E depicts a fifth stage of forming the nanosheet CMOS cell with vertical fins, according to embodiments of the present disclosure.
Figure 2F:
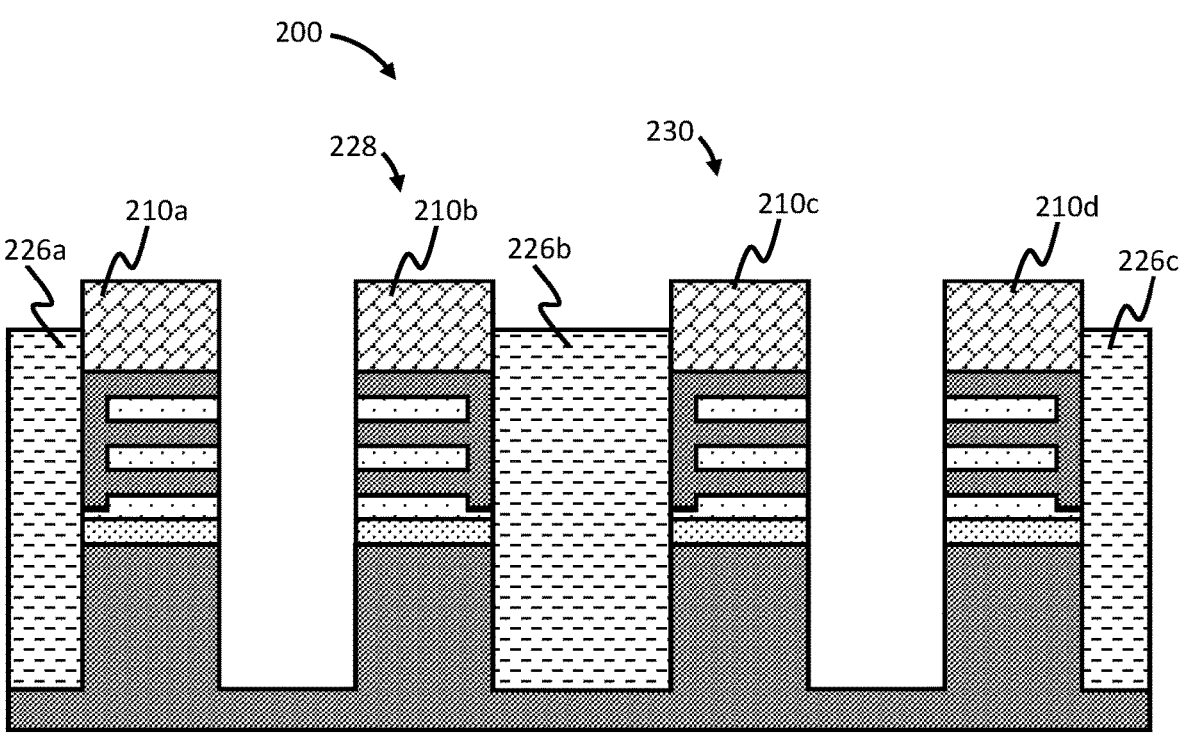
FIG. 2F depicts a sixth stage of forming the nanosheet CMOS cell with vertical fins, according to embodiments of the present disclosure.
Figures 2G, 2H:
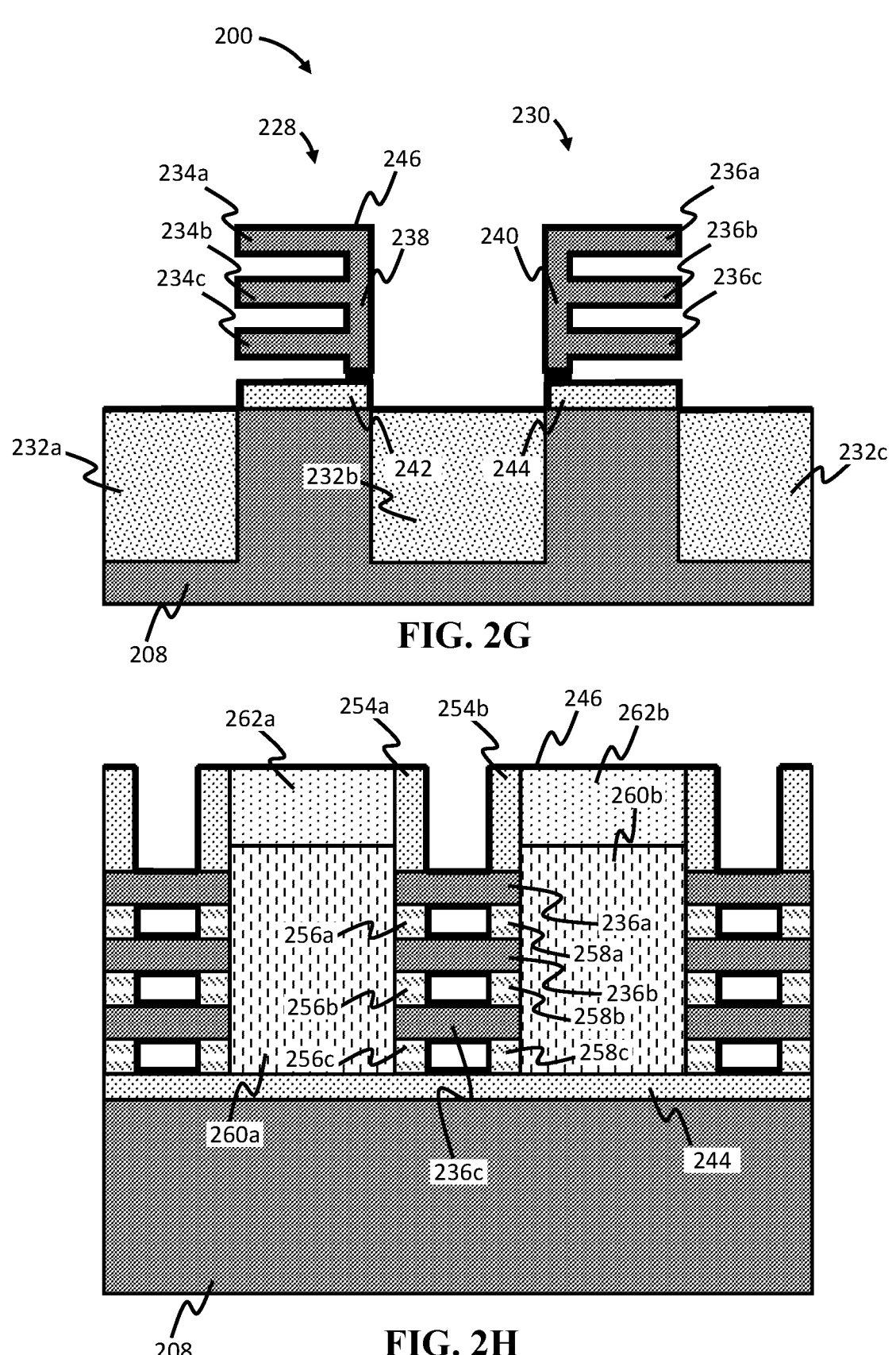
FIG. 2G depicts a seventh stage of forming the nanosheet CMOS cell with vertical fins, according to embodiments of the present disclosure.
FIG. 2H depicts a second view of the seventh stage of forming the nanosheet CMOS cell with vertical fins, according to embodiments of the present disclosure.
Figure 2I:
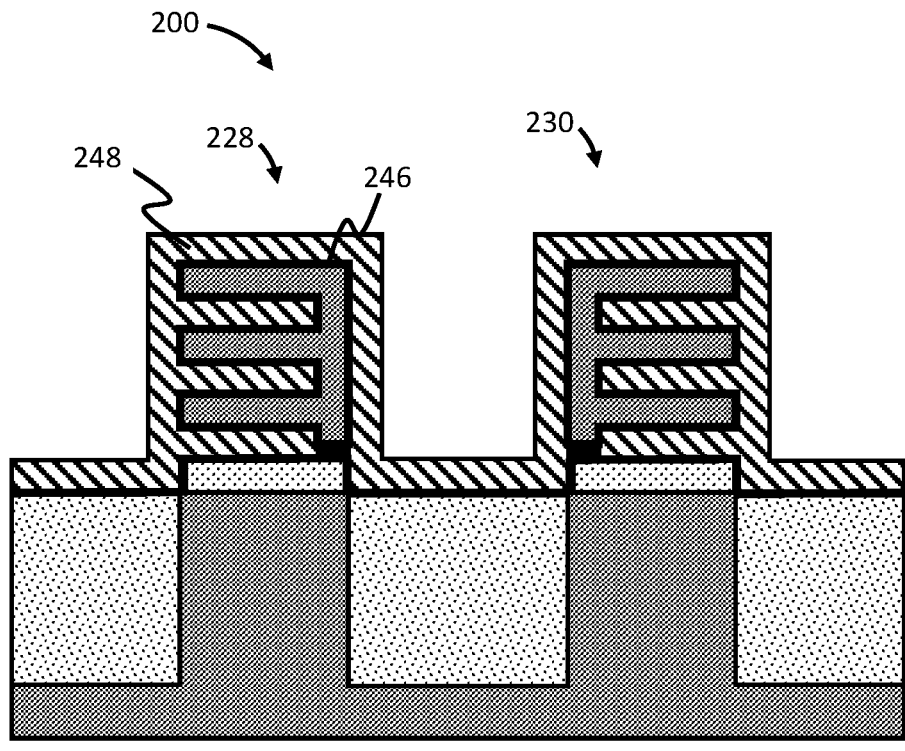
FIG. 2I depicts an eighth stage of forming the nanosheet CMOS cell with vertical fins, according to embodiments of the present disclosure.
Figure 2J:
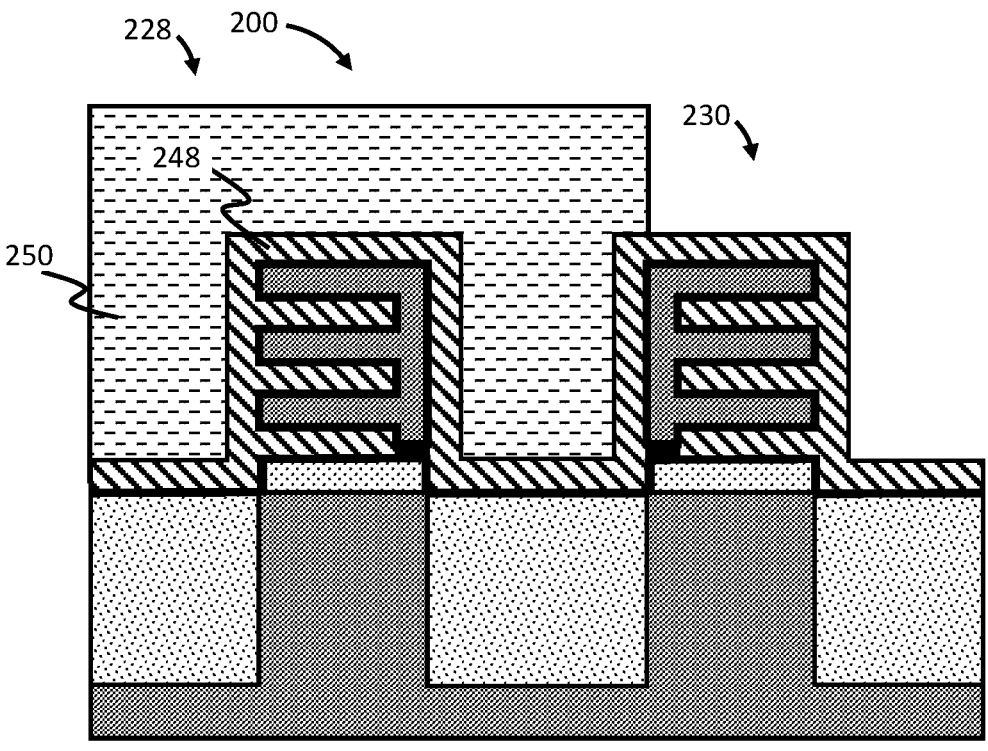
FIG. 2J depicts a ninth stage of forming the nanosheet CMOS cell with vertical fins, according to embodiments of the present disclosure.
Figure 2K:
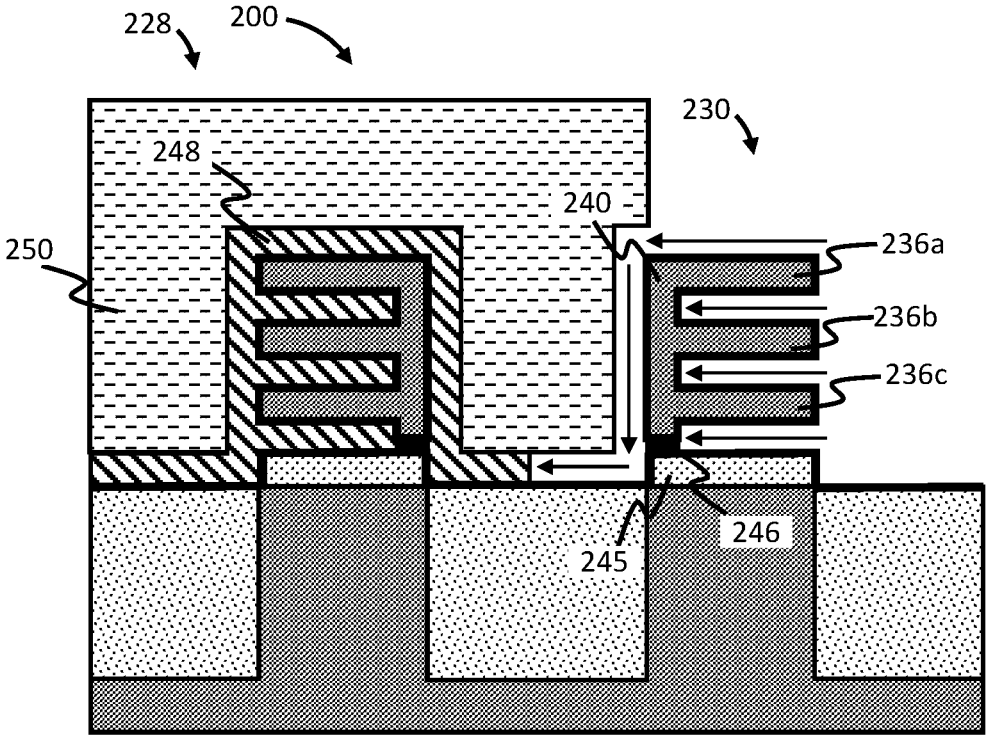
FIG. 2K depicts a tenth stage of forming the nanosheet CMOS cell with vertical fins, according to embodiments of the present disclosure.
Figure 2L:
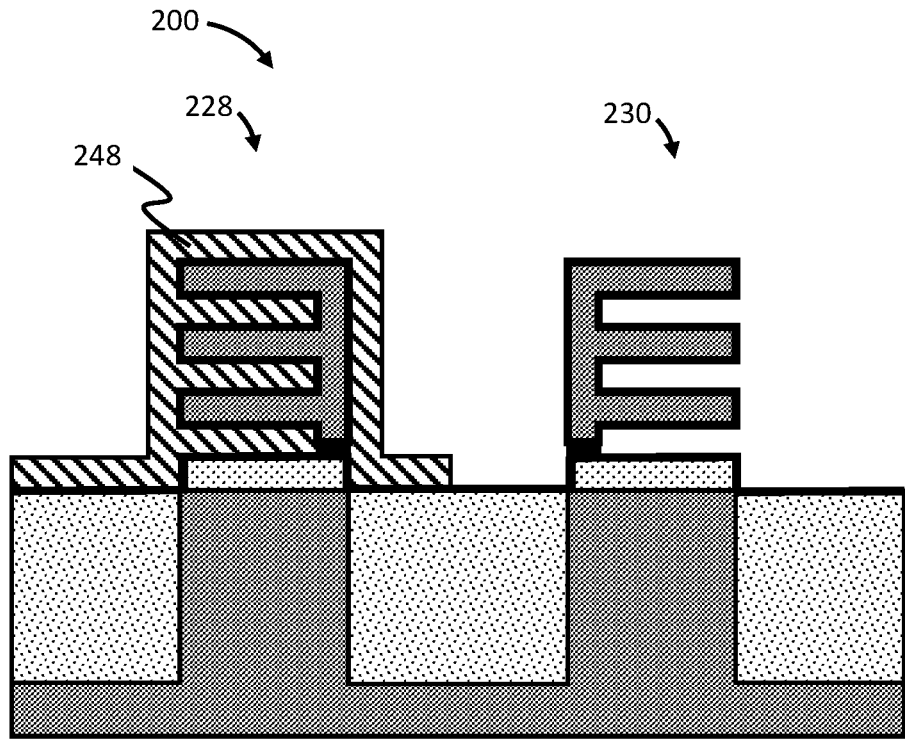
FIG. 2L depicts an eleventh stage of forming the nanosheet CMOS cell with vertical fins, according to embodiments of the present disclosure.
Figure 2M:
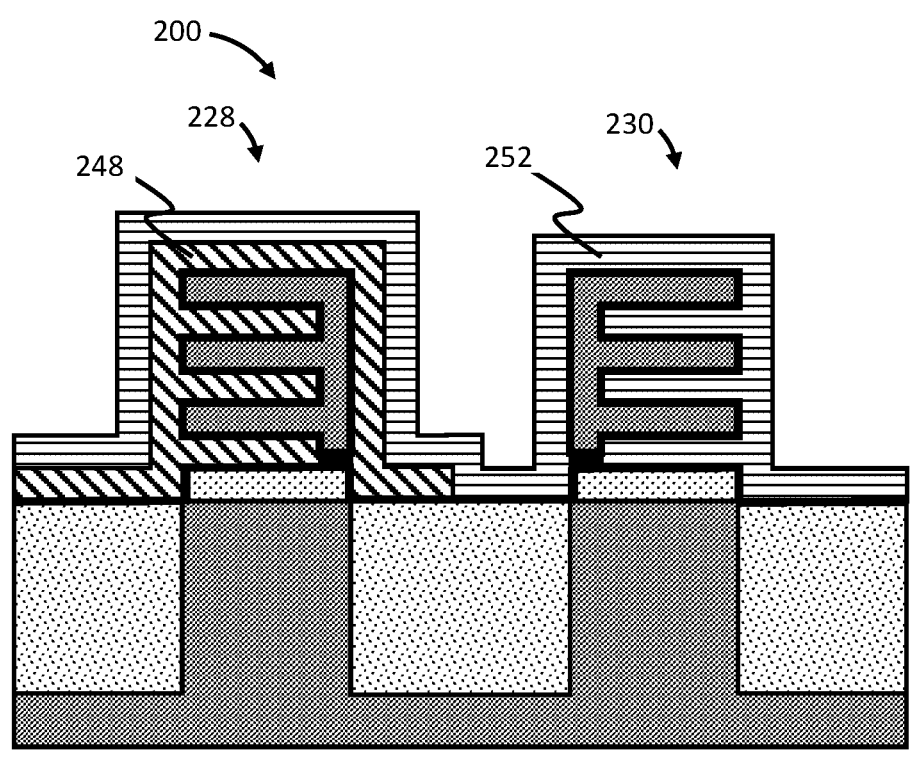
FIG. 2M depicts a twelfth stage of forming the nanosheet CMOS cell with vertical fins, according to embodiments of the present disclosure.
Figure 2N:
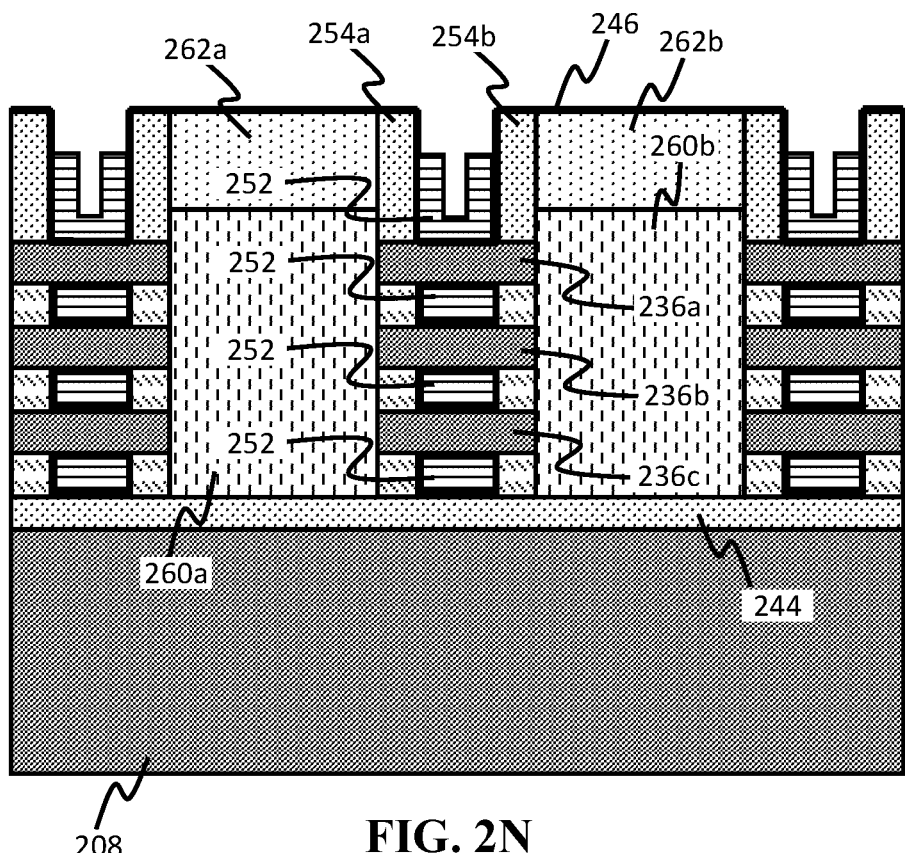
FIG. 2N depicts a second view of the twelfth stage of forming the nanosheet CMOS cell with vertical fins, according to embodiments of the present disclosure.

As such, FIGS. 2A-2N provide an example process for forming a CMOS cell with a channel of stacked nanosheets and a vertical blocking fin. Of note, the stages of FIGS. 2A-2N are presented as abstract, representative illustrations of important stages of forming a CMOS cell to provide persons of skill in the art with the knowledge necessary to form a CMOS cell such as CMOS cell 100. However, for the sake of simplicity, FIGS. 2A-2N do not explicitly illustrate every single stage that may be necessary for forming a CMOS cell. Further, FIGS. 2A-2N are not intended to be exact, precise representations of each presented stage of forming a CMOS cell; rather, persons of skill in the art may understand that some variations of certain stages are possible while not straying from the spirit of the embodiments of the present disclosure.

FIG. 2A depicts a first stage of forming nanosheet CMOS cell 200 with vertical fins, according to embodiments of the present disclosure. FIG. 2 depicts a stack of alternating sheets of silicon 202a, 202b, and 202c and sheets of between approximately 20% and 35% silicon germanium 204a, 204b, and 204c. These sheets may have been deposited in turn on a sheet of between approximately 50% and 70% silicon germanium 206, which is itself deposited on a region of silicon 208.

Sheets of silicon 202a, 202b, and 202c have been patterned to eventually form the horizontal nanosheets of the channel region of CMOS cell 200. Sheets of 25% silicon germanium 204a, 204b, and 204c, on the other hand, have been patterned to eventually form the gap between the nanosheets into which gate material will be formed. Thus, the thickness of each silicon sheet 202a-202c, may be chosen for that purpose. Further, the thickness of each 25% silicon germanium sheet 204a-204c may have been chosen to allow for sufficient space between each eventual silicon nanosheet.

FIG. 2B depicts a second stage of forming nanosheet CMOS cell 200. In FIG. 2B, hardmasks 210a, 210b, 210c, and 210d have been patterned on silicon sheet 202a. Further, blocking layer 212a has been patterned between hardmasks 210a and 210b, and blocking layer 212b has been patterned between hardmasks 210c and 210d. As will be illustrated in later figures, the space between hardmasks 210b and 210c eventually will divide a pFET region and nFET region of CMOS cell 200, and the space beneath blocking layers 212a and 212*b* will eventually separate CMOS cell 200 from other CMOS cells in a pattern.

FIG. 2C depicts a third stage of forming nanosheet CMOS cell 200. As illustrated, silicon sheets 202*a*-202*c* have been etched into silicon sheets 214*a*, 214*b*, 214*c*, 214*d*, 214*e*, and 214*f*. Further, 25% silicon germanium sheets 204*a*-204*c* have been etching into 25% silicon germanium sheets 216*a*, 216*b*, 216*c*, 216*d*, 216*e*, and 216*f*.

The structure illustrated in FIG. 2C may have been created, for example, by two etching processes. For example, a dry etch, such as a reactive ion etch, may have been performed on the structure illustrated in FIG. 2B, such that the spaces directly between hardmasks 210*b* and 210*c* and outside of hardmasks 210*a* and 210*d* may have been removed. At that point, a selective dry or wet-etch process such as conformal semiconductor trimming may have etched the exposed edges of silicon sheets 214*a*-214*f* and silicon germanium sheets 216*a*-216*f* beneath hardmasks 210*a*-210*d*. The result, as illustrated in FIG. 2C, is an empty space directly beneath the edges of each of hardmasks 210*a*-210*d* that also contacts the edges of each of silicon sheets 214*a*-214*f*.

FIG. 2D depicts a fourth stage of forming nanosheet CMOS cell 200. By applying a conformal EPI growth of to silicon sheets 214*a*-214*f* and 25% silicon germanium sheets 216*a*-216*f*, vertical fins 218, 220, 222, and 224 have been formed on silicon sheets 214*a*-214*f*. Vertical fins 220 and 222 will, in later stages, form vertical blocking fins of CMOS cell 200. As seen here and will be seen in FIG. 2E, forming vertical blocking fins for both pFET and nFET regions of CMOS cell 200 may result in a more efficient process, even if a vertical blocking fin in the pFET region may be unnecessary to protect the pFET gate.

FIG. 2E depicts a fifth stage of forming nanosheet CMOS cell 200. As illustrated, a reactive ion etching process has etched the material not covered by hardmasks 210*a*-210*d* or blocking layers 212*a*-212*b*. As noted previously, the gap between hardmasks 210*b* and 210*c* is now forming into the gap between an eventual pFET region and an eventual nFET region of CMOs cell 200.

FIG. 2F depicts a sixth stage of forming nanosheet CMOS cell 200. In FIG. 2F, organic planarization layers 226*a*, 226*b*, and 226*c* have been formed in CMOS cell 200, followed by the removal of blocking layers 212*a* and 212*b*. This enabled the reactive ion etching of the space between hardmasks 210*a* and 210*b* and the space between hardmasks 210*c* and 210*d*. As a result, pFET region 228 and nFET region 230 of CMOS cell 200 have been separated from other FETs in the patterned process by the gaps formed between these hardmask pairs. For simplicity, further views of FIGS. 2A-2N will present a more zoomed-in view of pFET region 228 and nFET region 230.

FIG. 2G depicts a seventh stage of forming nanosheet CMOS cell 200. FIG. 2H, depicts an alternative view of the seventh stage of forming nanosheet CMOS cell 200. FIG. 2H depicts a cross sectional view of a plane that is perpendicular to the plane illustrated in FIG. 2G and that bisects the center of silicon nanosheets 236*a*, 236*b*, and 236*c*. In FIG. 2G, organic planarization layers 226*a*-226*c* have been removed. After that, shallow trench isolation regions 232*a*, 232*b*, 232*c* are formed by dielectric deposition, CMP and dielectric recess, followed by hardmask 210 removal.

A dummy gate (not shown) formed is formed between gate spacers 254*a* and 254*b*, as illustrated by FIG. 2H. Specifically, this involves the selective removal of sacrificial layer 206 (e.g. by a vapor phased dry HCl etch). After that, gate spacers 254*a* and 254*b* and bottom dielectric isolation (BDI) 242, 244 are formed, followed by inner spacers 256*a*, 256*b*, 256*c* and 258*a*, 258*b*, and 258*c*, and source/drain epi 260*a* and 260*b* formation. Then interlay dielectric (ILD) 262*a* and 262*b* is deposited over source/drain epi 260*a* and 260*b*, followed by CMP process to reveal the dummy gate (not shown). After that, the dummy gate and sacrificial layer 204*a*, 204*b* and 204*c* are removed. The forms of silicon nanosheets 234*a*, 234*b*, and 234*c*; silicon nanosheets 236*a*, 236*b*, and 236*c*; and silicon vertical blocking fins 238 and 240 are now evident. Finally, a thin gate dielectric layer 246 (e.g., hafnium oxide) has been formed upon the exposed surfaces of CMOS cell 200, and is illustrated as a black outline. Of note, thin insulation layer 246 is illustrating as partially or completely plugging a gap between vertical blocking fin 240 and insulation layer 244.

FIG. 2I depicts an eighth stage of forming nanosheet CMOS cell 200. In FIG. 2I, pFET work function material 248 has been added to the exposed surfaces of CMOS cell 200 (i.e., to thin insulating layer 246. pFET work function material 248 forms a portion of the gate in pFET region 228. Thus, the pFET work function material may be referred to as the initial work function material, and the nFET work function material may be referred to as the subsequent work function material.

FIG. 2J depicts a ninth stage of forming nanosheet CMOS cell 200. In this stage, litho mask layer 250 (e.g. an organic planarization layer) has been deposited and patterned (for example, using conventional lithography and etch process) to protect pFET region 228. Organic planarization layer 250 is designed to protect the portion of pFET work function material 248 that will form the gate for pFET region 228. As illustrated, organic planarization layer 250 also overlaps into nFET region 230. The extent of this overlap may be based on the dimensions and properties of nFET region 230, and their effects on a comparison of the expected rates of (1) etching the unwanted portions of pFET work function material 248 in nFET region 230 and (2) etchant flowing into pFET region 228 and etching the portion of pFET work function material 248 that forms the gate in pFET region 228. If the risk of etching flowing into the pFET region is expected to be high, a greater overlap may be chosen. If, on the other hand, the risk is expected to be low, a smaller overlap may be chosen to increase the rate of etching in nFET region 230.

FIG. 2K depicts a tenth stage of forming nanosheet CMOS cell 200. This stage illustrates the process and result of etching the unwanted pFET work function material 248 from nFET region 230. The flow of etchant to produce this etching is disclosed by a set of flow arrows. Of note, the flow of etchant that is between nanosheets 236*a*, 236*b*, 236*c* and isolation layer 244 has been blocked from proceeding towards pFET region 228 by vertical blocking fin 240 and the accumulation of thin insulating layer 246 between nanosheet 236*c* and isolation layer 244. As a result, the flow of etchant has been prevented from reaching pFET region 228 and damaging the pFET work function material therein.

FIG. 2L depicts an eleventh stage of forming nanosheet CMOS cell 200. In this eleventh stage, the etching of pFET work function material 248 has been completed and litho mask layer 250 has been removed. If litho mask layer 250 takes the form of an organic planarization layer, for example, it may be removed by ashing.

Finally, FIG. 2M and FIG. 2N depict a twelfth stage of forming nanosheet CMOS cell 200. FIG. 2N depicts a cross sectional view of a plane that is perpendicular to the plane illustrated in FIG. 2M and that bisects the center of silicon nanosheets 236*a*, 236*b*, and 236*c*. In the twelfth stage, a layer of nFET work function material 252 has been deposited on the exposed surfaces of CMOS cell 200. nFET work function material 252 thus forms the gate for nFET region 230, as well as completes the gate for pFET region 228.

As noted above, the particular form of a vertical blocker fin in some embodiments of the present disclosure may vary based on the expected use case and other properties of the CMOS cell. For example, if nFET and pFET regions of the CMOS cell are spaced far apart, less damage to pFET-region work function material may be expected. Sometimes, the size of the vertical blocker fin can also be adjusted to change the effective channel width.

Figure 3:
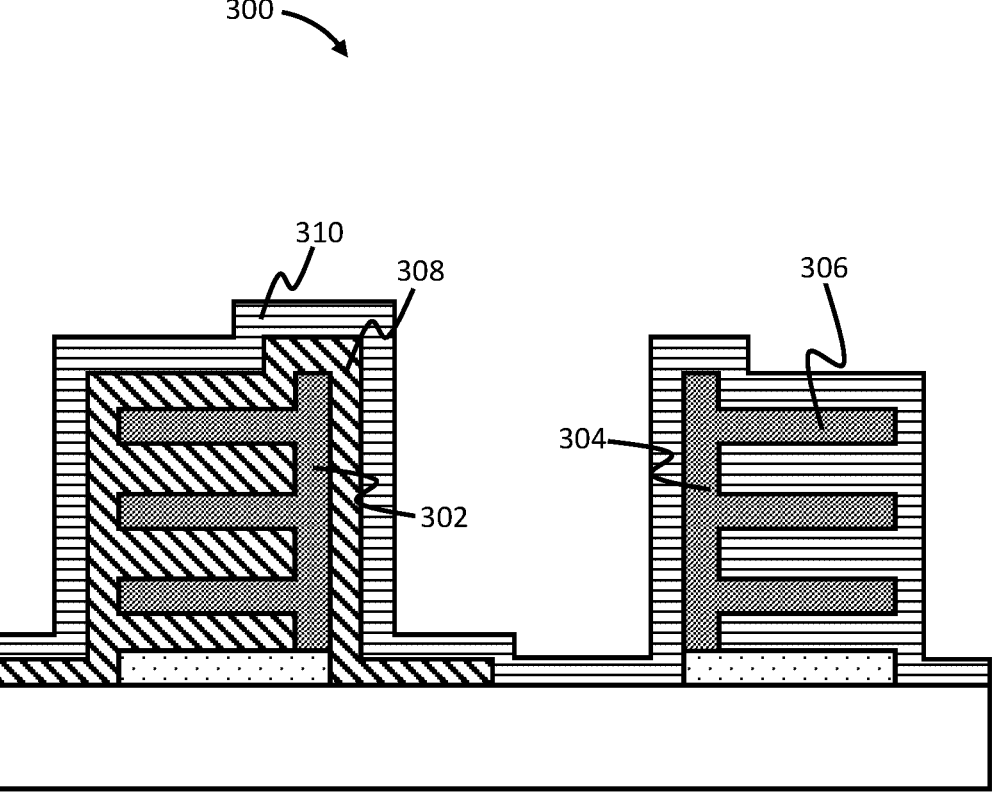
FIG. 3 depicts a nanosheet CMOS cell with extended vertical blocker fins.

For example, FIG. 3 depicts a nanosheet CMOS cell 300 with extended vertical blocker fins 302 and 304, because vertical blocker fin 304 extends above nanosheet 306, this provides even larger effective channel width for high performance purpose.

CMOS cell 300 may be formed in a similar process as shown in FIGS. 2A-2N. For example, CMOS cell 300 contains initial work function material 308 and subsequent work function material 310. Initial work function material 308 could be either a pFET work function material or an nFET work function material. Subsequent work function material 310 would typically be the opposite work function material. For example, if initial work function material 308 were an nFET work function material, subsequent work function material 310 would be a pFET work function material. However, in FIG. 2A, adding additional sacrificial layer 204 over the top nanosheet layer 202a may enable the formation of an extended vertical blocker fin in FIG. 2D.

As a further example, FIG. 4 depicts a nanosheet CMOS cell 400 with shortened blocker fins 402 and 404. Because vertical blocker fin 404 does not completely seal the gap between nanosheet 406 and insulating layer 408, vertical blocker fin 404 allows some etchant to flow under nanosheet 404 and towards the pFET region. This may be beneficial, for example, in use cases in which the pFET work function material is expected to be removed from the rest of the channel in the nFET region relatively quickly while N2P space is not highly scaled.

CMOS cell 400 may be formed in a similar process as shown in FIGS. 2A-2N. However, in FIG. 2C, the etching and conformal trimming may be limited in such a way that 25% silicon-germanium sheet 204c is not etched and remains completely intact.

Figure 5:
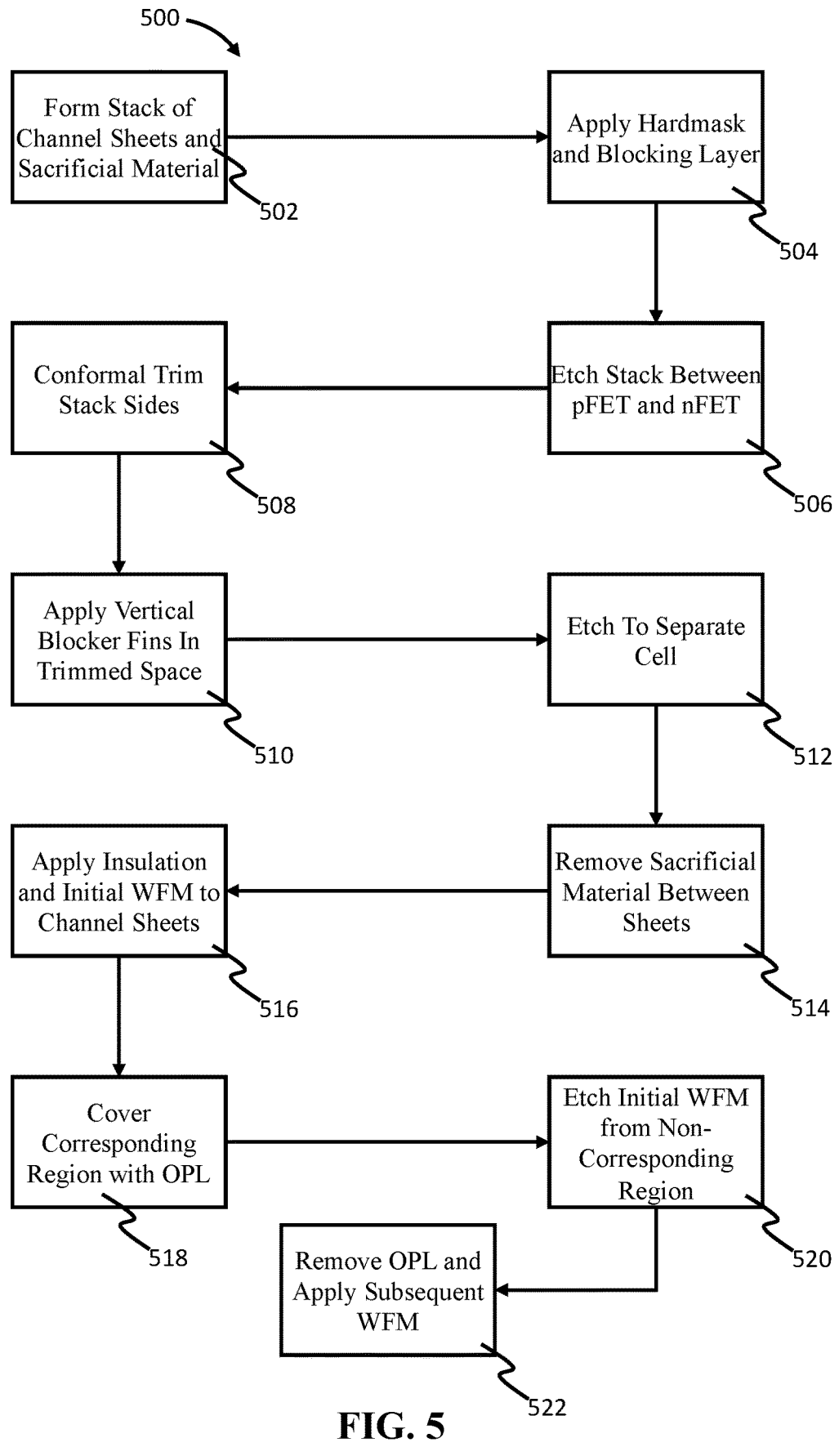
FIG. 5 depicts a method of forming a nano sheet CMOS cell with vertical fins, according to embodiments of the present disclosure.

For the sake of understanding, FIG. 5 illustrates a method 500 of forming CMOS cell with a vertical blocker fin in accordance with embodiments of the present disclosure. It is of note that method 500 is presented as a generalized process by which many structures of the embodiments of the present disclosure may be formed. Thus, like the stages of FIGS. 2A-2N, the specifics of each operation of method 500 may vary based upon the precise implementation of the method and the properties of the devices formed.

For example, method 500 may, as illustrated, be utilized to form a CMOS cell of the first type discussed above (i.e., pFET gate covered by nFET work function material) or a CMOS cell of the second type discussed above (i.e., nFET gate covered by pFET work function material).

It is of further note that the blocks depicted in method 500 could be performed by a computer system, such as computer system 601, that is automatically or semi-automatically forming a pattern of CMOS cells.

Method 500 begins in block 502, in which a stack of alternating channel sheets and sheets of sacrificial material is formed. The channel sheets may be composed of silicon, and the sacrificial material may be composed of 25% silicon germanium. The result of block 502 may resemble the stage depicted in FIG. 2A.

Method 500 continues in block 504, in which hardmasks and blocking layers are applied to the top sheet in the stack that was formed in block 502. These hardmasks may be positioned to allow etching between nFET and pFET regions, as shown in FIGS. 2B and 2E. Similarly, blocking layers may be patterned between the hardmasks to allow etching to separate between the FETs of one CMOS cell from another CMOS cell, as is shown in FIGS. 2B and 2F.

Method 500 continues in block 506, in which the stack between the pFET and nFET region is etched. This may be performed using a dry etch, such as reactive ion etching, to etch a line straight down from the hardmasks that were applied in block 504. The result of block 506 may resemble the first discussed portion of FIG. 2C before conformal trimming.

Method 500 continues in block 508, in which the sides of the stack formed in block 502 are trimmed using a conformal semiconductor trimming. Block 506 may result in the hardmask overhangs illustrated in FIG. 2C.

Method 500 continues in block 510 in which vertical blocker fins are applied in the space trimmed in block 508. As discussed above, these vertical blocker fins may be applied using epi silicon growth, and may cause the vertical blocker fin to bond with the nanosheets of silicon within the stack formed in block 502. The result of block 510 may resemble FIG. 2D.

Method 500 continues in block 512 in which the CMOS cell is separated from adjacent CMOS cells by etching. In some embodiments, this may involve removing the blocking layer that was applied in block 504. Block 512 may also involve applying protection to other areas of the CMOS cell, such as the region between the eventual pFET and nFET regions. The result of block 512 may resemble FIG. 2F.

Method 500 continues in block 514 in which the sacrificial material that was formed in the stack with the channel nanosheets in block 502 is removed. This may result in a set of nanosheets that are ready for the application of gate materials. In some embodiments, block 514 may also involve adding spacers between each pair of nanosheets to protect the structural integrity of the stack of nanosheets. The result of block 514 may resemble FIG. 2G.

Method 500 continues in block 516 in which a thin layer of insulation is applied to the exposed surfaces of the CMOS cell, followed by a layer of initial work function material. This initial work function material may be a pFET work function material or nFET work function material depending on whether the CMOS cell being formed is of the first type discussed above (i.e., pFET gate covered by nFET work function material) or of the second type discussed above (i.e., nFET gate covered by pFET work function material). In other words, this work function material may serve as a portion of the eventual gate in the pFET region in the first CMOS cell type or the nFET region in the second CMOS cell type. The result of block 516 may resemble FIG. 2I.

Method 500 continues in block 518 in which the region of the CMOS cell that corresponds to the initial work function material is covered with an organic planarization layer. In other words, in the first CMOS cell type, the pFET region would be covered by the organic planarization layer. In the second CMOS cell type, the nFET region would be covered by the organic planarization layer. This organic planarization layer may be designed to protect the corresponding gate portion of the WFM from etchant. In some embodiments, the organic planarization layer may also extend into the non-corresponding region of the CMOS cell. The extent to which the organic planarization layer is applied to extend into the non-corresponding region may depend on the expected rate of etching the initial WFM in the corresponding region and the non-corresponding region, as discussed in FIGS. 2J-2K. The result of block 518 may resemble FIG. 2J.

Method 500 continues in block 520 in which the initial WFM is etched away from the non-corresponding region. In some embodiments, the vertical blocker fin that was applied in block 510 may slow the flow of etchant towards the corresponding region of the CMOS cell, and may thus prevent damage to the corresponding region's WFM. The result of block 500 may resemble FIG. 2K.

Method 500 concludes with block 522, in which the OPL is removed from the corresponding region, and subsequent work function material is applied to the exposed surfaces of the CMOS cell. This subsequent work function material may form the gate for the non-corresponding region, and may complete the gate for the corresponding region. The result of block 522 may resemble FIG. 2M.

Figure 6:
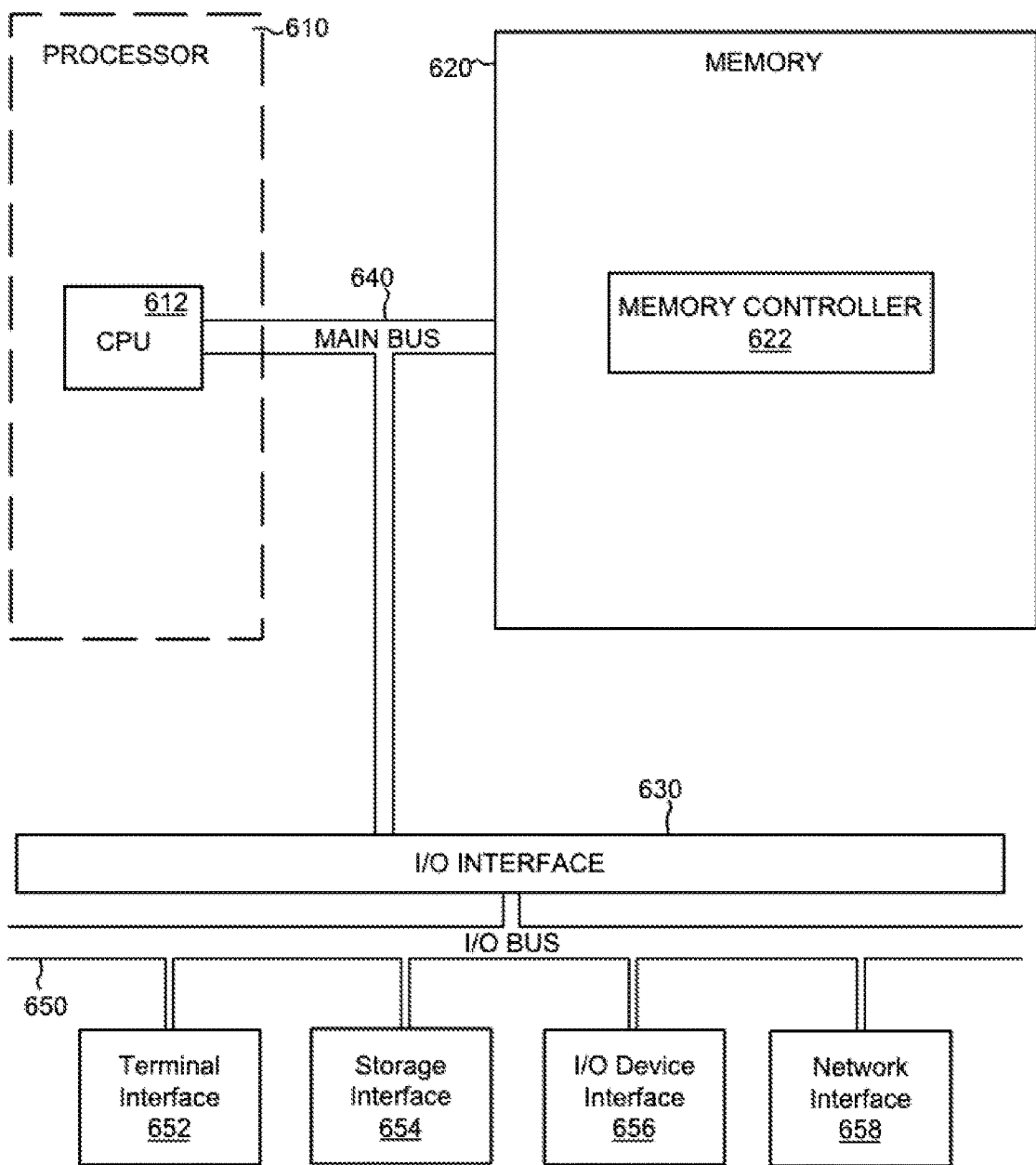
FIG. 6 depicts a computer system that may be used in performing the embodiments of the present disclosure.

FIG. 6 depicts the representative major components of an example Computer System 601 that may be used in accordance with embodiments of the present disclosure. The particular components depicted are presented for the purpose of example only and are not necessarily the only such variations. The Computer System 601 may include a Processor 610, Memory 620, an Input/Output Interface (also referred to herein as I/O or I/O Interface) 630, and a Main Bus 640. The Main Bus 640 may provide communication pathways for the other components of the Computer System 601. In some embodiments, the Main Bus 640 may connect to other components such as a specialized digital signal processor (not depicted).

The Processor 610 of the Computer System 601 may include one or more CPUs 612. The Processor 610 may additionally include one or more memory buffers or caches (not depicted) that provide temporary storage of instructions and data for the CPU 612. The CPU 612 may perform instructions on input provided from the caches or from the Memory 620 and output the result to caches or the Memory 620. The CPU 612 may include one or more circuits configured to perform one or more methods consistent with embodiments of the present disclosure. In some embodiments, the Computer System 601 may contain multiple Processors 610 typical of a relatively large system. In other embodiments, however, the Computer System 601 may contain a single processor with a singular CPU 612.

The Memory 620 of the Computer System 601 may include a Memory Controller 622 and one or more memory modules for temporarily or permanently storing data (not depicted). In some embodiments, the Memory 620 may include a random-access semiconductor memory, storage device, or storage medium (either volatile or non-volatile) for storing data and programs. The Memory Controller 622 may communicate with the Processor 610, facilitating storage and retrieval of information in the memory modules. The Memory Controller 622 may communicate with the I/O Interface 630, facilitating storage and retrieval of input or output in the memory modules. In some embodiments, the memory modules may be dual in-line memory modules.

The I/O Interface 630 may include an I/O Bus 650, a Terminal Interface 652, a Storage Interface 654, an I/O Device Interface 656, and a Network Interface 658. The I/O Interface 630 may connect the Main Bus 640 to the I/O Bus 650. The I/O Interface 630 may direct instructions and data from the Processor 610 and Memory 620 to the various interfaces of the I/O Bus 650. The I/O Interface 630 may also direct instructions and data from the various interfaces of the I/O Bus 650 to the Processor 610 and Memory 620. The various interfaces may include the Terminal Interface 652, the Storage Interface 654, the I/O Device Interface 656, and the Network Interface 658. In some embodiments, the various interfaces may include a subset of the aforementioned interfaces (e.g., an embedded computer system in an industrial application may not include the Terminal Interface 652 and the Storage Interface 654).

Logic modules throughout the Computer System 601—including but not limited to the Memory 620, the Processor 610, and the I/O Interface 630—may communicate failures and changes to one or more components to a hypervisor or operating system (not depicted). The hypervisor or the operating system may allocate the various resources available in the Computer System 601 and track the location of data in Memory 620 and of processes assigned to various CPUs 612. In embodiments that combine or rearrange elements, aspects of the logic modules' capabilities may be combined or redistributed. These variations would be apparent to one skilled in the art.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A nanosheet CMOS cell comprising:
   a transistor region comprising a stack of nanosheet channels;
   a vertical blocker fin attached to at least one channel of the stack of nanosheet channels; and
   a bottom insolation layer immediately below the stack of nanosheet channels.

2. The nanosheet CMOS cell of claim 1, wherein at least a portion of the vertical blocker fin extends above a top surface of the stack of nanosheet channels.

3. The nanosheet CMOS cell of claim 1, further comprising:
   a work function material between and physically separating the vertical blocker fin from the bottom insolation layer.

4. The nanosheet CMOS cell of claim 1, further comprising:
   a gate dielectric between and physically separating the vertical blocker fin from the bottom insolation layer.

5. The nanosheet CMOS cell of claim 1, wherein each channel in the stack of nanosheet channels comprises a first end opposite a second end, wherein the vertical blocker fin contacts the first end of each channel in the stack of nanosheet channels, and wherein the second end of each channel in the stack of nanosheet channels is flush with a sidewall of the bottom insolation layer.

6. The nanosheet CMOS cell of claim 1, wherein the vertical blocker fin is entirely above the bottom insolation layer.

7. The nanosheet CMOS cell of claim 1, wherein each channel in the stack of nanosheet channels comprises a first end and a second end, wherein the vertical blocker fin contacts the first end of each channel in the stack of nanosheet channels, and wherein the second end of each channel in the stack of nanosheet channels is surrounded by a work function metal.

8. A nanosheet CMOS cell comprising:
   a stack of nanosheet channels;

15

16 a vertical blocker fin directly contacting first sidewalls of all channels of the stack of nanosheet channels; and a bottom insolation layer immediately below the stack of nanosheet channels, wherein a sidewall of the bottom insolation layer is flush with second sidewalls of all the channels of the stack of nanosheet channels.

9. The nanosheet CMOS cell of claim 8, wherein at least a portion of the vertical blocker fin extends above a top surface of the stack of nanosheet channels.

10. The nanosheet CMOS cell of claim 8, further comprising:

a work function material between and physically separating the vertical blocker fin from the bottom insolation layer.

11. The nanosheet CMOS cell of claim 8, further comprising:

a gate dielectric between and physically separating the vertical blocker fin from the bottom insolation layer.

12. The nanosheet CMOS cell of claim 8, wherein the vertical blocker fin is entirely above the bottom insolation layer.

13. The nanosheet CMOS cell of claim 8, wherein the second sidewalls of all channels of the stack of nanosheet channels are surrounded by a work function metal.

14. A nanosheet CMOS cell comprising:

a first transistor comprising a first stack of nanosheet channels;

a first vertical blocker fin in direct contact with ends of each channel of the first stack of nanosheet channels;

a first bottom insolation layer immediately below the first stack of nanosheet channels;

a second transistor adjacent to the first transistor, the second transistor comprising a second stack of nanosheet channels;

a second vertical blocker fin in direct contact with ends of each channel of the second stack of nanosheet channels; and a second bottom insolation layer immediately below the second stack of nanosheet channels, wherein both the first vertical blocker fin and the second vertical blocker fin are arranged between the first transistor and the second transistor.

15. The nanosheet CMOS cell of claim 14, wherein at least a portion of the first vertical blocker fin extends above a top surface of the first stack of nanosheet channels, and wherein at least a portion of the second vertical blocker fin extends above a top surface of the second stack of nanosheet channels.

16. The nanosheet CMOS cell of claim 14, further comprising:

a first work function material between and physically separating the first vertical blocker fin from the first bottom insolation layer; and a second work function material between and physically separating the second vertical blocker fin from the second bottom insolation layer.

17. The nanosheet CMOS cell of claim 14, further comprising:

a gate dielectric between and physically separating the first vertical blocker fin from the first bottom insolation layer, wherein the gate dielectric is between and physically separating the second vertical blocker fin from the second bottom insolation layer.

18. The nanosheet CMOS cell of claim 14, wherein each channel in the first stack of nanosheet channels comprises a first end opposite a second end, wherein the first vertical blocker fin contacts the first end of each channel in the first stack of nanosheet channels, and wherein the second end of each channel in the first stack of nanosheet channels is flush with a sidewall of the first bottom insolation layer.

19. The nanosheet CMOS cell of claim 14, wherein the first vertical blocker fin is entirely above the first bottom insolation layer, and wherein the second vertical blocker fin is entirely above the second bottom insolation layer.

20. The nanosheet CMOS cell of claim 14, wherein each channel in the first stack of nanosheet channels comprises a first end and a second end, wherein the first vertical blocker fin contacts the first end of each channel in the first stack of nanosheet channels, and wherein the second end of each channel in the first stack of nanosheet channels is surrounded by a work function metal.

* * * * *